United States Patent
Koshimizu (10) Patent No.: US 11,562,887 B2
(45) Date of Patent: Jan. 24, 2023

(54) PLASMA PROCESSING APPARATUS AND ETCHING METHOD

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 102 days.

(21) Appl. No.: 16/699,289

(22) Filed: Nov. 29, 2019

(65) Prior Publication Data
US 2020/0185193 A1    Jun. 11, 2020

(30) Foreign Application Priority Data

Dec. 10, 2018  (JP) .............................. JP2018-230849
Nov. 20, 2019  (JP) .............................. JP2019-209863

(51) Int. Cl.
    *H01J 37/32*    (2006.01)

(52) U.S. Cl.
    CPC .. *H01J 37/32091* (2013.01); *H01J 37/32706* (2013.01); *H01J 37/32935* (2013.01)

(58) Field of Classification Search
    CPC .......... H01J 37/32091; H01J 37/32706; H01J 37/32935; H01J 37/32577; H01J 37/32642; H01J 37/32183; H01J 37/32174; H01J 2237/334
    See application file for complete search history.

(56) References Cited

U.S. PATENT DOCUMENTS

| | | | |
|---|---|---|---|
| 2009/0071938 A1* | 3/2009 | Dhindsa | H01J 37/32568 216/67 |
| 2010/0018648 A1* | 1/2010 | Collins | H01J 37/32082 156/345.24 |
| 2015/0325413 A1* | 11/2015 | Kim | H01J 37/32082 315/111.21 |
| 2016/0056017 A1* | 2/2016 | Kim | H01J 37/32706 156/345.28 |
| 2016/0351404 A1* | 12/2016 | Aramaki | H01J 37/32715 |
| 2019/0228952 A1* | 7/2019 | Dorf | H01L 21/3065 |
| 2020/0118796 A1* | 4/2020 | Arakelyan | H01J 37/32715 |
| 2020/0135527 A1* | 4/2020 | Sung | H01L 21/6833 |

FOREIGN PATENT DOCUMENTS

JP     2008227063 A     9/2008

* cited by examiner

*Primary Examiner* — Ram N Kackar
*Assistant Examiner* — Laureen Chan
(74) *Attorney, Agent, or Firm* — Studebaker & Brackett PC (57) ABSTRACT

A substrate support is provided in a chamber of a plasma processing apparatus according to an exemplary embodiment. The substrate support has a lower electrode and an electrostatic chuck. A matching circuit is connected between a power source and the lower electrode. A first electrical path connects the matching circuit and the lower electrode to each other. A second electrical path different from the lower electrode is provided to supply electric power from the matching circuit to a focus ring. A sheath adjuster is configured to adjust a position of an upper end of a sheath on/above the focus ring. A variable impedance circuit is provided on the first or second electrical path.

16 Claims, 8 Drawing Sheets

PLASMA PROCESSING APPARATUS AND ETCHING METHOD

CROSS-REFERENCE TO RELATED APPLICATIONS

This application is based on and claims the benefit of priority from Japanese Patent Application No. 2018-230849 filed on Dec. 10, 2018 and Japanese patent Application No. 2019-209863 filed on Nov. 20, 2019, the entire contents of which are incorporated herein by reference.

FIELD

Exemplary embodiments of the present disclosure relate to a plasma processing apparatus and an etching method.

BACKGROUND

In plasma etching of a substrate, a plasma processing apparatus is used. The plasma processing apparatus is provided with a chamber, an electrostatic chuck, and a lower electrode. The electrostatic chuck and the lower electrode are provided in the chamber. The electrostatic chuck is provided on the lower electrode. The electrostatic chuck supports a focus ring placed thereon. The electrostatic chuck supports a substrate disposed in a region surrounded by the focus ring. When etching is performed in the plasma processing apparatus, a gas is supplied into the chamber. Further, radio frequency power is supplied to the lower electrode. Plasma is formed from the gas in the chamber. The substrate is etched by chemical species such as ions and radicals from the plasma.

When the plasma etching is performed, the focus ring wears down, so that the thickness of the focus ring is reduced. In a case where the thickness of the focus ring is reduced, the position of an upper end of a plasma sheath (hereinafter referred to as a "sheath") on/above the focus ring is lowered. The position in a vertical direction of the upper end of the sheath on/above the focus ring should be equal to the position in the vertical direction of the upper end of the sheath on/above the substrate. Therefore, Japanese Patent Application Laid-Open Publication No. 2008-227063 discloses a plasma processing apparatus making it possible to adjust the position in the vertical direction of the upper end of the sheath on/above the focus ring. The plasma processing apparatus disclosed in this publication is configured to apply a direct-current voltage to the focus ring.

SUMMARY

In an exemplary embodiment, a plasma processing apparatus is provided. The plasma processing apparatus includes a chamber, a substrate support, a power source, a matching circuit, a first electrical path, a second electrical path, a sheath adjuster, and a variable impedance circuit. The substrate support has a lower electrode and an electrostatic chuck. The electrostatic chuck is provided on the lower electrode. The substrate support is configured to support a focus ring and a substrate placed thereon in the chamber. The power source is configured to generate electric power having periodicity. The matching circuit is connected between the power source and the lower electrode. The first electrical path connects the matching circuit and the lower electrode to each other. The second electrical path is an electrical path different from the lower electrode and the first electrical path and is provided to supply the electric power from the matching circuit to the focus ring. The sheath adjuster is configured to adjust a position in a vertical direction of an upper end of a sheath on/above the focus ring. The variable impedance circuit is provided on the first electrical path or the second electrical path.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Hereinafter, various exemplary embodiments will be described.

In an exemplary embodiment, a plasma processing apparatus is provided. The plasma processing apparatus includes a chamber, a substrate support, a power source, a matching circuit, a first electrical path, a second electrical path, a sheath adjuster, and a variable impedance circuit. The substrate support has a lower electrode and an electrostatic chuck. The electrostatic chuck is provided on the lower electrode. The substrate support is configured to support a focus ring and a substrate placed thereon in the chamber. The power source is configured to generate electric power having periodicity. The electric power having periodicity can be radio frequency power or a pulsed negative direct-current voltage which is generated periodically. The matching circuit is connected between the power source and the lower electrode. The first electrical path connects the matching circuit and the lower electrode to each other. The second electrical path is an electrical path different from the lower electrode and the first electrical path and is provided to supply the electric power from the matching circuit to the focus ring. The sheath adjuster is configured to adjust a position in a vertical direction of an upper end of a sheath on/above the focus ring. The variable impedance circuit is provided on the first electrical path or the second electrical path.

According to the plasma processing apparatus of the aforementioned embodiment, it becomes possible to adjust the position in the vertical direction of the upper end of the sheath on/above the focus ring by the sheath adjuster. In addition, by adjusting the impedance of the variable impedance circuit, it is possible to adjust the ratio between the power level of the electric power flowing through the first electrical path and the power level of the electric power flowing through the second electrical path. As a result, it becomes possible to reduce the difference between the etching rate at the edge of the substrate and the etching rate of the substrate inside the edge.

In an exemplary embodiment, the sheath adjuster may be a power source configured to apply a negative voltage to the focus ring. The negative voltage may be a radio frequency voltage or a direct-current voltage. The radio frequency voltage may be a pulsed radio frequency voltage. The direct-current voltage may be a pulsed direct-current voltage.

In an exemplary embodiment, each cycle of the electric power which is generated by the power source includes a first partial period and a second partial period. The second partial period is a period different from the first partial period. The level of the negative voltage that the sheath adjuster applies to the focus ring in the first partial period may be different from the level of the negative voltage that the sheath adjuster applies to the focus ring in the second partial period.

In an exemplary embodiment, the sheath adjuster may be a movement device configured to move the focus ring upward to adjust a position in a vertical direction of an upper surface of the focus ring.

In an exemplary embodiment, the plasma processing apparatus may further include a sensor and a controller. The sensor is configured to acquire a measurement value reflecting a power level of electric power flowing through the first electrical path. The controller may be configured to control an impedance of the variable impedance circuit according to the measurement value to set a power level of a electric power flowing through the first electrical path to a predetermined level.

In an exemplary embodiment, the plasma processing apparatus may further include a controller. The controller may be configured to set an impedance of the variable impedance circuit to an impedance determined in advance according to a level of the negative voltage.

In an exemplary embodiment, the plasma processing apparatus may further include a controller. The controller may be configured to set an impedance of the variable impedance circuit to an impedance determined in advance according to an amount of upward movement of the focus ring.

In an exemplary embodiment, a first variable impedance circuit, which is the variable impedance circuit described above, may be provided on the first electrical path. The plasma processing apparatus may further include a second variable impedance circuit provided on the second electrical path.

In an exemplary embodiment, the plasma processing apparatus may further include a first sensor, a second sensor, and a controller. The first sensor is configured to acquire a first measurement value. The first measurement value represents a power level of electric power flowing through the first electrical path. The second sensor is configured to acquire a second measurement value. The second measurement value represents a power level of electric power flowing through the second electrical path. The controller is configured to control an impedance of the first variable impedance circuit and/or an impedance of the second variable impedance circuit to set the power level of electric power flowing through the first electrical path to a predetermined level. The controller controls the impedance of the first variable impedance circuit and/or the impedance of the second variable impedance circuit according to the first measurement value and/or the second measurement value.

In an exemplary embodiment, the plasma processing apparatus may further include a controller. The controller is configured to set the impedance of the first variable impedance circuit and the impedance of the second variable impedance circuit to respective impedances determined in advance according to a level of the negative voltage.

In an exemplary embodiment, the plasma processing apparatus may further include a controller. The controller is configured to set the impedance of the first variable impedance circuit and the impedance of the second variable impedance circuit to respective impedances determined in advance according to the amount of upward movement of the focus ring.

In another exemplary embodiment, an etching method using a plasma processing apparatus is provided. The plasma processing apparatus is the plasma processing apparatus according to any one of the exemplary embodiments described above. The etching method includes determining an adjustment amount of a position in a vertical direction of an upper end of the sheath which is to be set by the sheath adjuster. The etching method further includes determining an impedance of the variable impedance circuit to set a power level of electric power flowing through the first electrical path to a predetermined level. The etching method further includes supplying the electric power which is generated by the power source through the first electrical path and the second electrical path for plasma etching of a substrate placed on the electrostatic chuck. The supplying is performed in a state where the position in the vertical direction of the upper end of the sheath is adjusted by the determined adjustment amount by the sheath adjuster and the impedance of the variable impedance circuit is adjusted to the determined impedance.

Hereinafter, various exemplary embodiments will be described in detail with reference to the drawings. In the respective drawings, identical or equivalent parts are denoted by the same reference symbols.

Figure 1:
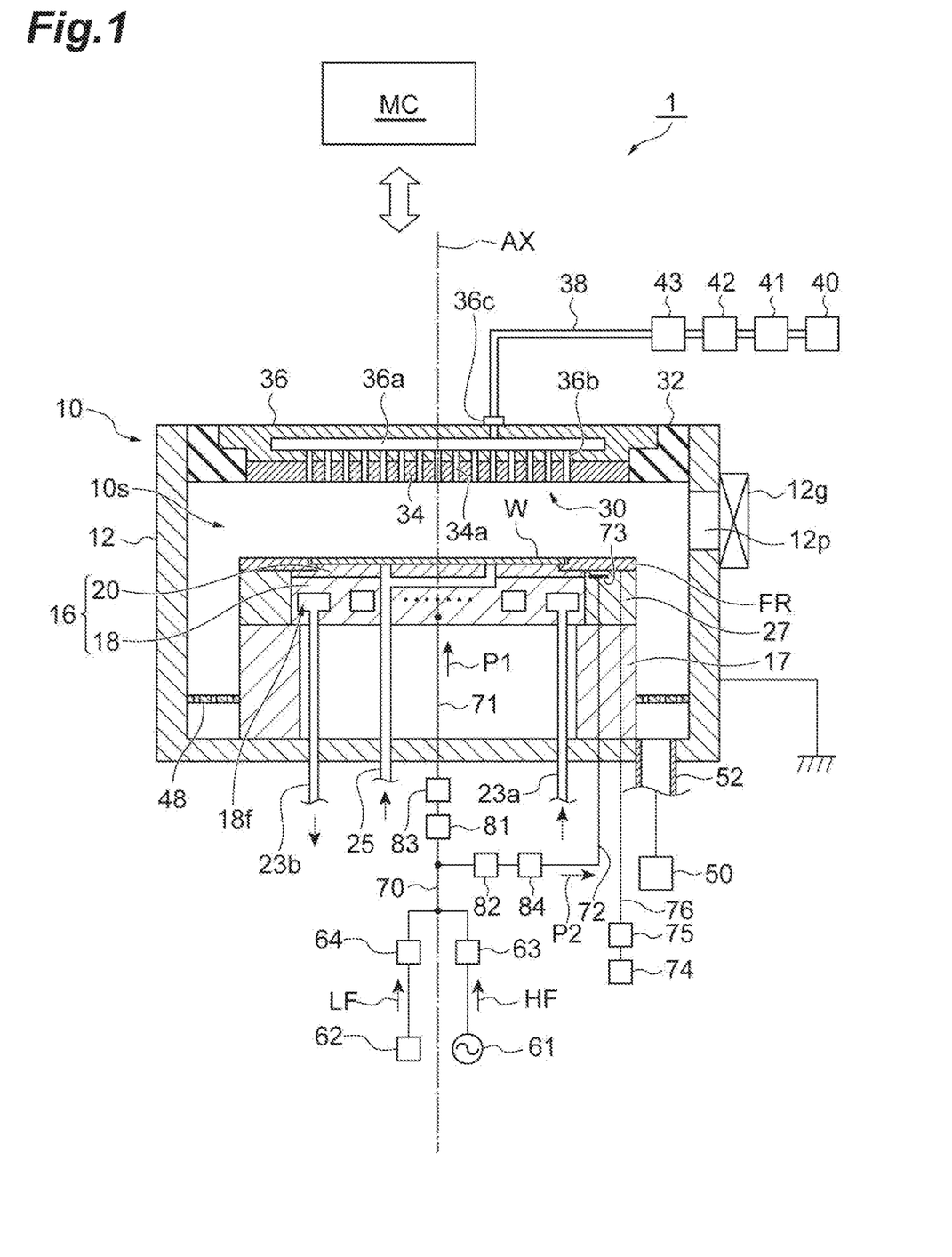
FIG. 1 schematically illustrates a plasma processing apparatus according to an exemplary embodiment.

FIG. 1 schematically illustrates a plasma processing apparatus according to an exemplary embodiment. A plasma processing apparatus 1 shown in FIG. 1 is a capacitively coupled plasma processing apparatus. The plasma processing apparatus 1 is provided with a chamber 10. The chamber 10 provides an internal space 10s therein. The central axis of the internal space 10s is an axis AX which extends in the vertical direction. In an embodiment, the chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. A film having plasma resistance is formed on the inner wall surface of the chamber body 12, that is, the wall surface defining the internal space 10s. The film may be a film formed by anodization or a ceramic film such as a film formed of yttrium oxide.

A passage 12p is formed in the side wall of the chamber body 12. A substrate W passes through the passage 12p when it is transferred between the internal space 10s and the outside of the chamber 10. A gate valve 12g is provided along the side wall of the chamber body 12 for the opening and closing of the passage 12p.

The plasma processing apparatus 1 is further provided with a substrate support 16. The substrate support 16 is configured to support the substrate W placed thereon in the chamber 10. The substrate W has a substantially disk shape. The substrate support 16 is supported by the supporting part 17. The supporting part 17 extends upward from a bottom portion of the chamber body 12. The supporting part 17 has a substantially cylindrical shape. The supporting part 17 is formed of an insulating material such as quartz.

The substrate support 16 includes a lower electrode 18 and an electrostatic chuck 20. The lower electrode 18 and the electrostatic chuck 20 are provided in the chamber 10. The lower electrode 18 is formed of a conductive material such as aluminum and has a substantially disk shape.

A flow path 18f is formed in the lower electrode 18. The flow path 18f is a flow path for a heat exchange medium. As the heat exchange medium, a liquid refrigerant or a refrigerant (for example, chlorofluorocarbon) that cools the lower electrode 18 by vaporization thereof is used. A supply device of the heat exchange medium (for example, a chiller unit) is connected to the flow path 18f. This supply device is provided outside the chamber 10. The heat exchange medium is supplied to the flow path 18f from the supply device through a pipe 23a. The heat exchange medium supplied to the flow path 18f is returned to the supply device through a pipe 23b.

The electrostatic chuck 20 is provided on the lower electrode 18. The substrate W is placed on the electrostatic chuck 20 and held by the electrostatic chuck 20 when it is processed in the internal space 10s.

The electrostatic chuck 20 has a main body and an electrode. The main body of the electrostatic chuck 20 is formed of a dielectric such as aluminum oxide or aluminum nitride. The main body of the electrostatic chuck 20 has a substantially disk shape. The central axis of the electrostatic chuck 20 substantially coincides with the axis AX. The electrode of the electrostatic chuck 20 is provided in the main body. The electrode of the electrostatic chuck 20 has a film shape. A direct-current power source is electrically connected to the electrode of the electrostatic chuck 20 through a switch. When the voltage from the direct-current power source is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

The electrostatic chuck 20 includes a substrate placing region and a focus ring placing region. The substrate placing region is a region having a substantially disk shape. The central axis of the substrate placing region substantially coincides with the axis AX. The substrate W is placed on the upper surface of the substrate placing region when it is processed in the chamber 10.

The focus ring placing region extends in a circumferential direction to surround the substrate placing region around the central axis of the electrostatic chuck 20. A focus ring FR is mounted on the upper surface of the focus ring placing region. The focus ring FR has a ring shape. The focus ring FR is placed on the focus ring placing region such that the central axis thereof coincides with the axis AX. The substrate W is disposed in a region surrounded by the focus ring FR. The focus ring FR may have electrical conductivity. The focus ring FR is formed of, for example, silicon or silicon carbide.

The plasma processing apparatus 1 can be further provided with a gas supply line 25. The gas supply line 25 supplies a heat transfer gas, for example, He gas, from a gas supply mechanism to an area between the upper surface of the electrostatic chuck 20 and the rear surface (lower surface) of the substrate W.

The plasma processing apparatus 1 can be further provided with an insulating region 27. The insulating region 27 is disposed on the supporting part 17. The insulating region 27 is disposed outside the lower electrode 18 in a radial direction with respect to the axis AX. The insulating region 27 extends in the circumferential direction along the outer peripheral surface of the lower electrode 18. The insulating region 27 is formed of an insulator such as quartz. The focus ring FR is placed on the insulating region 27 and the focus ring placing region.

The plasma processing apparatus 1 is further provided with an upper electrode 30. The upper electrode 30 is provided above the substrate support 16. The upper electrode 30 closes an upper opening of the chamber body 12 together with a member 32. The member 32 has an insulating property. The upper electrode 30 is supported on an upper portion of the chamber body 12 through the member 32.

The upper electrode 30 includes a top plate 34 and a support 36. The lower surface of the top plate 34 defines the internal space 10s. A plurality of gas discharge holes 34a are formed in the top plate 34. Each of the plurality of gas discharge holes 34a penetrates the top plate 34 in a plate thickness direction (the vertical direction). Although being not limited, the top plate 34 is formed of silicon, for example. Alternatively, the top plate 34 may have a structure in which a plasma-resistant film is provided on the surface of a member made of aluminum. This film may be a film formed by anodization or a ceramic film such as a film formed of yttrium oxide.

The support 36 detachably supports the top plate 34. The support 36 is formed of a conductive material such as aluminum, for example. A gas diffusion chamber 36a is provided in the interior of the support 36. A plurality of gas holes 36b extend downward from the gas diffusion chamber 36a. The plurality of gas holes 36b communicate with the plurality of gas discharge holes 34a, respectively. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply the gases from one or more gas sources selected from the plurality of gas sources of the gas source group 40 to the internal space 10s at individually adjusted flow rates.

A baffle plate 48 is provided between the substrate support 16 or the supporting part 17 and the side wall of the chamber body 12. The baffle plate 48 may be configured, for example, by coating a member made of aluminum with ceramic such as yttrium oxide. A number of through-holes are formed in the baffle plate 48. An exhaust pipe 52 is connected to the bottom portion of the chamber body 12 below the baffle plate 48. An exhaust device 50 is connected to the exhaust pipe 52. The exhaust device 50 includes a pressure controller such as an automatic pressure control valve, and a vacuum pump such as a turbo molecular pump, and is capable of reducing the pressure in the internal space 10s.

The plasma processing apparatus 1 is further provided with at least one power source. The at least one power source is configured to generate electric power having periodicity. In an embodiment, the plasma processing apparatus 1 may be further provided with a radio frequency power source 61 as the power source that generates electric power having periodicity. The radio frequency power source 61 is a power source that generates radio frequency power HF for plasma generation. The radio frequency power HF has a frequency within the range of 27 to 100 MHz, for example, a frequency of 40 MHz or 60 MHz. The radio frequency power source 61 is connected to the lower electrode 18 through a matching circuit 63 to supply the radio frequency power HF to the lower electrode 18. That is, the matching circuit 63 is connected between the radio frequency power source 61 and the lower electrode 18. The matching circuit 63 is configured to match the output impedance of the radio frequency power source 61 with the impedance on the load side (the lower electrode 18 side). The radio frequency power source 61 may not be electrically connected to the lower electrode 18 and may be connected to the upper electrode 30 through the matching circuit 63.

In an embodiment, the plasma processing apparatus 1 may be further provided with a power source 62 as the power source that generates electric power having periodicity. The power source 62 is a power source that generates bias power LF for drawing ions into the substrate W. In an embodiment, the power source 62 can be a power source that generates radio frequency power as the bias power LF. The frequency of the radio frequency power which is generated by the power source 62 is lower than the frequency of the radio frequency power HF. The frequency of the radio frequency power which is generated by the power source 62 is a frequency within the range of 400 kHz to 13.56 MHz and is, for example, 400 kHz. The power source 62 is connected to the lower electrode 18 through a matching circuit 64 to supply the bias power LF to the lower electrode 18. That is, the matching circuit 64 is connected between the power source 62 and the lower electrode 18. The matching circuit 64 is configured to match the output impedance of the power source 62 with the impedance on the load side (the lower electrode 18 side). The radio frequency power that is the bias power LF may be pulsed radio frequency power that is generated periodically. That is, the supply and the supply stop of the radio frequency power from the power source 62 to the lower electrode 18 may be alternately switched. In another embodiment, the power source 62 may be configured to periodically apply a pulsed negative direct-current voltage as the bias power LF to the lower electrode 18. The level of the pulsed negative direct-current voltage may change during the period in which the pulsed negative direct-current voltage is applied to the lower electrode 18.

The plasma processing apparatus 1 is further provided with a first electrical path 71 and a second electrical path 72. The first electrical path 71 connects each of the matching circuit 63 and the matching circuit 64 and the lower electrode 18 to each other. The radio frequency power HF and the bias power LF are supplied to the lower electrode 18 through the first electrical path 71. Electric power P1 flowing through the first electrical path 71 includes the bias power LF and the radio frequency power HF.

In a case where the radio frequency power source 61 is electrically connected to the upper electrode 30 through the matching circuit 63, the first electrical path 71 connects the matching circuit 64 and the lower electrode 18 to each other. In this case, the electric power P1 includes the bias power LF. Further, the electric power P1 may include radio frequency power flowing into the first electrical path 71 through the upper electrode 30, the plasma, and the lower electrode 18.

The second electrical path 72 is an electrical path different from the first electrical path 71. Further, the second electrical path 72 is an electrical path different from the lower electrode 18. That is, the second electrical path 72 is an electrical path which does not include the lower electrode 18. The second electrical path 72 is provided to supply the radio frequency power HF from the matching circuit 63 to the focus ring FR and supply the bias power LF from the matching circuit 64 to the focus ring FR. Electric power P2 flowing through the second electrical path 72 includes the bias power LF and the radio frequency power HF.

In an embodiment, the first electrical path 71 and the second electrical path 72 are branched from a common electrical path 70. In an embodiment, the second electrical path 72 extends from a branch point on the electrical path 70 to an electrode 73 below the focus ring FR. The electrode 73 is provided in the insulating region 27. The second electrical path 72 may pass through the supporting part 17 between the branch point on the electrical path 70 and the insulating region 27.

In a case where the radio frequency power source 61 is electrically connected to the upper electrode 30 through the matching circuit 63, the second electrical path 72 connects the matching circuit 64 and the electrode 73 to each other. In this case, the electric power P2 includes the bias power LF. Further, the electric power P2 may include radio frequency power flowing into the second electrical path 72 through the upper electrode 30, the plasma, and the lower electrode 18.

In a case where plasma etching is performed in the plasma processing apparatus 1, a gas is supplied to the internal space 10s. Then, the radio frequency power HF and/or the bias power LF is supplied, whereby the gas is excited in the internal space 10s. As a result, plasma is generated in the internal space 10s. The substrate W is etched by chemical species such as ions and/or radicals from the generated plasma. That is, the plasma etching is performed.

Figure 2A:
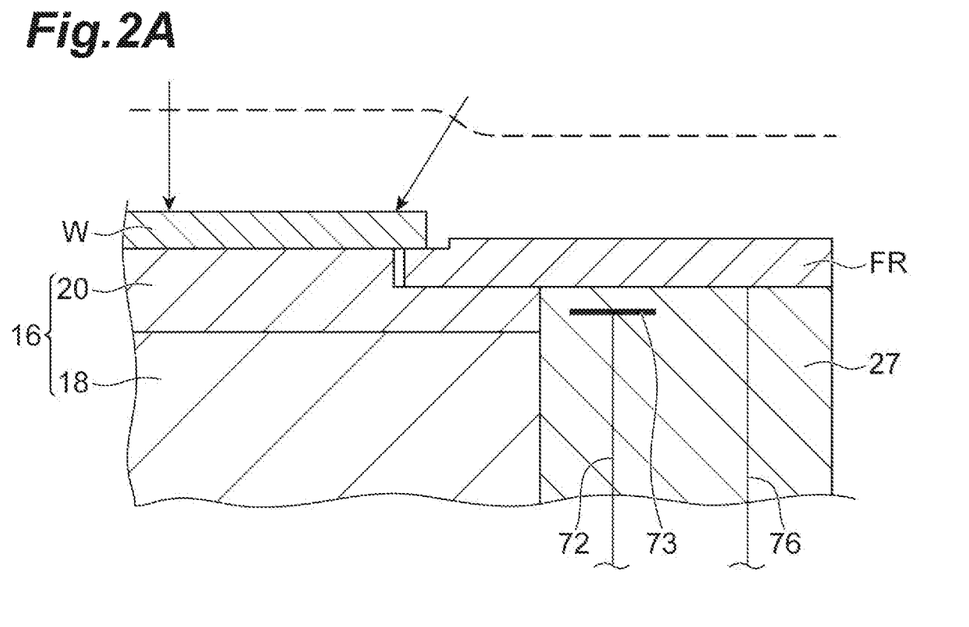
FIG. 2A illustrates an example of a position in a vertical direction of an upper end of a sheath in a state where a focus ring has worn down.
Figure 2B:
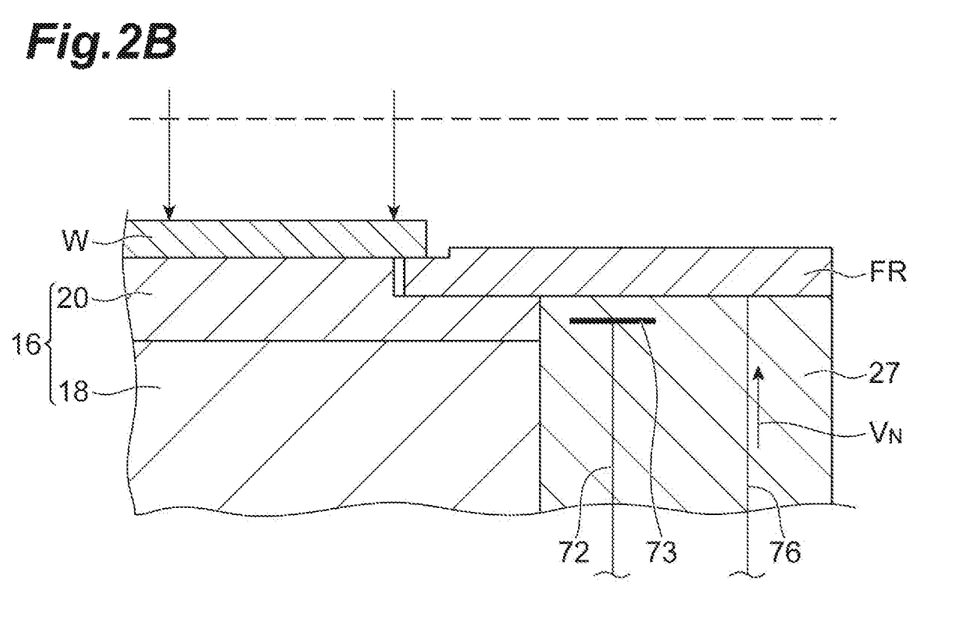
FIG. 2B illustrates an example of a corrected position in a vertical direction of an upper end of a sheath.

Hereinafter, FIGS. 2A and 2B are referred to. FIG. 2A illustrates an example of a position in a vertical direction of an upper end of a sheath in a state where a focus ring has worn down. FIG. 2B illustrates an example of a corrected position in a vertical direction of an upper end of a sheath. In each of FIG. 2A and FIG. 2B, the position in the vertical direction of the upper end (hereinafter referred to as an "upper end position") of the sheath is indicated by a broken line. Further, in each of FIG. 2A and FIG. 2B, a traveling direction of ions to the substrate W is indicated by an arrow.

When the plasma etching of the substrate W is performed, the focus ring FR wears down as shown in FIG. 2A. In a case where the focus ring FR has worn down, the thickness of the focus ring FR is reduced, so that the position in the vertical direction of the upper surface of the focus ring FR is lowered. In a case where the position in the vertical direction of the upper surface of the focus ring FR is lowered, the upper end position of the sheath on/above the focus ring FR becomes lower than the upper end position of the sheath on/above the substrate W. As a result, the upper end of the sheath is inclined in the vicinity of the edge of the substrate W, and thus the traveling direction of ions which are supplied to the edge of the substrate W becomes a direction inclined with respect to the vertical direction.

In order to correct the traveling direction of ions to the vertical direction (that is, the direction perpendicular to the edge of the substrate W), the plasma processing apparatus 1 is further provided with a sheath adjuster 74, as shown in FIG. 1. The sheath adjuster 74 is configured to adjust the upper end position of the sheath on/above the focus ring FR. The sheath adjuster 74 adjusts the upper end position of the sheath on/above the focus ring FR to eliminate or reduce the difference between the upper end position of the sheath on/above the focus ring FR and the upper end position of the sheath on/above the substrate W.

In an embodiment, the sheath adjuster 74 is a power source configured to apply a negative voltage $V_N$ to the focus ring FR. In this embodiment, the sheath adjuster 74 is connected to the focus ring FR through a filter 75 and a conducting wire 76. The filter 75 is a filter for blocking or reducing radio frequency power flowing into the sheath adjuster 74.

The voltage $V_N$ may be a direct-current voltage or a radio frequency voltage. The level of the voltage $V_N$ determines the adjustment amount of the upper end position of the sheath. The adjustment amount of the upper end position of the sheath, that is, the level of the voltage $V_N$ is determined according to a parameter that reflects the thickness of the focus ring FR. This parameter may be a measured value of the thickness of the focus ring FR which is measured optically or electrically, the position in the vertical direction of the upper surface of the focus ring FR which is measured optically or electrically, or the length of a time when the focus ring FR is exposed to the plasma. The level of the voltage $V_N$ is determined using a predetermined relationship between such a parameter and the level of the voltage $V_N$. For example, the predetermined relationship between the parameter and the level of the voltage $V_N$ is determined in advance such that the absolute value of the voltage $V_N$ increases as the thickness of the focus ring FR decreases. When the voltage $V_N$ having the determined level is applied to the focus ring FR, the difference between the upper end position of the sheath on/above the focus ring FR and the upper end position of the sheath on/above the substrate W is eliminated or reduced, as shown in FIG. 2B.

The voltage $V_N$ may be a pulsed radio frequency voltage or a pulsed direct-current voltage. That is, the voltage $V_N$ may be periodically applied to the focus ring FR. In a case where as the voltage $V_N$, the pulsed direct-current voltage is periodically applied to the focus ring FR, the level of the voltage $V_N$ may change during the period in which the voltage $V_N$ is applied to the focus ring FR.

When the upper end position of the sheath is corrected by the sheath adjuster 74, the impedance of a path from the second electrical path 72 to the plasma through the focus ring FR increases. This is because the thickness of the sheath increases on/above the focus ring FR in a case where the upper end position of the sheath is adjusted by applying the voltage $V_N$ to the focus ring FR. In a case where the impedance of the path from the second electrical path 72 to the plasma through the focus ring FR increases, the electric power P2 decreases. Further, in a case where the impedance of the path from the second electrical path 72 to the plasma through the focus ring FR increases, the electric power P1 relatively increases. As a result, the etching rate of the substrate W inside the edge becomes higher than the etching rate at the edge of the substrate W.

In order to reduce the difference between the etching rate at the edge of the substrate and the etching rate of the substrate inside the edge, the plasma processing apparatus 1 has at least one variable impedance circuit. That is, a variable impedance circuit is provided in the first electrical path 71, the second electrical path 72, or each of them.

In an embodiment, the plasma processing apparatus 1 is provided with a variable impedance circuit 81 (that is, a first variable impedance circuit) and a variable impedance circuit 82 (that is, a second variable impedance circuit). The variable impedance circuit 81 is provided on the first electrical path 71. The variable impedance circuit 82 is provided on the second electrical path 72. The plasma processing apparatus 1 may be provided with only one of the variable impedance circuits 81 and 82.

The variable impedance circuit 81 may be a circuit having any configuration as long as it is a circuit in which the impedance thereof is variable. In an example, the variable impedance circuit 81 can include a variable capacitance capacitor. The variable impedance circuit 82 may also be a circuit having any configuration as long as it is a circuit in which the impedance thereof is variable. In an example, the variable impedance circuit 82 can include a variable capacitance capacitor.

As described above, according to the plasma processing apparatus 1, it becomes possible to adjust the upper end position of the sheath on/above the focus ring FR by the sheath adjuster 74. Further, it is possible to adjust an electric power distribution ratio by adjusting the impedance of at least one of the variable impedance circuits 81 and 82. As a result, it becomes possible to reduce the difference between the etching rate at the edge of the substrate W and the etching rate of the substrate W inside the edge. The electric power distribution ratio is a ratio between the power level of the electric power P1 and the power level of the electric power P2.

In an embodiment, the plasma processing apparatus 1 can be further provided with a controller MC. The controller MC is a computer which includes a processor, a storage device, an input device, a display device, and the like, and controls each part of the plasma processing apparatus 1. Specifically, the controller MC executes a control program stored in the storage device and controls each part of the plasma processing apparatus 1, based on recipe data stored in the storage device. A process designated by the recipe data is executed in the plasma processing apparatus 1 by the control by the controller MC. An etching method according to an embodiment to be described later may be executed in the plasma processing apparatus 1 by the control of each part of the plasma processing apparatus 1 by the controller MC.

The controller MC can determine the level of the voltage $V_N$, as described above. The predetermined relationship between the parameter described above and the level of the voltage $V_N$ may be stored in the storage device of the controller MC as a function or table format data. The controller MC can control the sheath adjuster 74 to apply the voltage $V_N$ having the determined level to the focus ring FR.

In an embodiment, the plasma processing apparatus 1 may be further provided with at least one sensor. The at least one sensor is configured to acquire a measurement value that reflects the power level of the electric power P1. In the present embodiment, the controller MC controls the impedance of at least one of the variable impedance circuits 81 and 82 to set the power level of the electric power P1 to a predetermined level. The impedance of at least one impedance circuit is controlled according to the measurement value acquired by the at least one sensor.

In an embodiment, the plasma processing apparatus 1 is provided with a sensor 83 and a sensor 84. The sensor 83 is connected between the variable impedance circuit 81 and the lower electrode 18. The sensor 83 is configured to acquire a first measurement value that represents the power level of the electric power P1. The sensor 83 can be, for example, a current sensor configured to measure the electric current in the first electrical path 71. The sensor 84 is connected between the variable impedance circuit 82 and the electrode 73. The sensor 84 is configured to acquire a second measurement value that indirectly represents the power level of the electric power P1. The second measurement value directly represents the power level of the electric power P2. In an example, the sensor 84 can be, for example, a current sensor configured to measure the electric current in the second electrical path 72. The plasma processing apparatus 1 may be provided with only one of the sensor 83 and the sensor 84.

In an embodiment, the controller MC controls the impedance of at least one of the variable impedance circuits 81 and 82 to set the power level of the electric power P1 to a predetermined level. The impedance of at least one impedance circuit is set according to the measurement value acquired by the at least one sensor described above.

In an embodiment, the controller MC may be configured to set the impedance of at least one of the variable impedance circuits 81 and 82 to an impedance determined in advance according to the level of the voltage $V_N$. The impedance corresponding to the voltage $V_N$ is determined in advance such that the power level of the electric power P1 is substantially constant without depending on the level of the voltage $V_N$. The impedance corresponding to the voltage $V_N$ may be stored in the storage device of the controller MC as a function or table format data.

Figure 3:
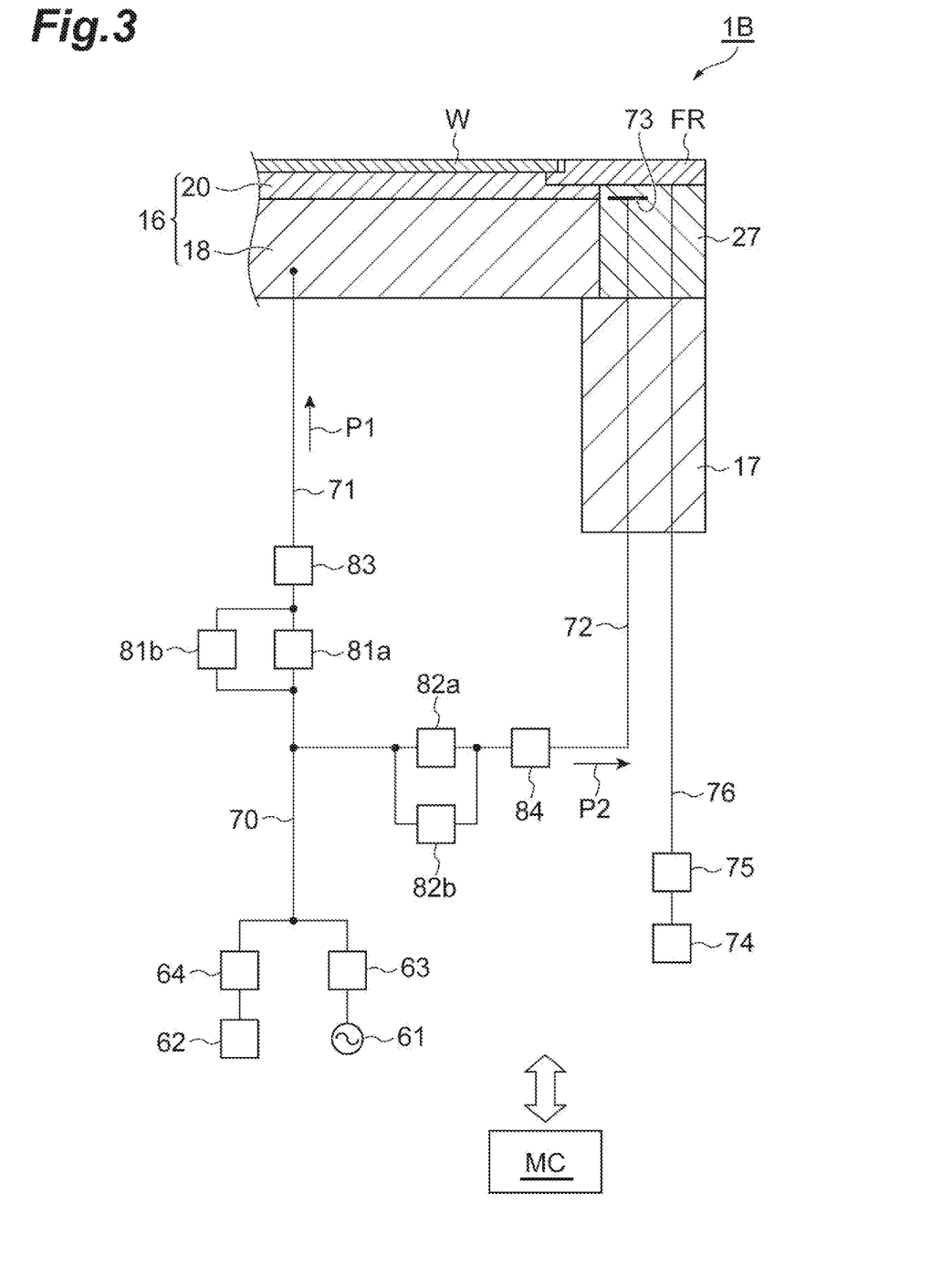
FIG. 3 is an enlarged view of a part of a plasma processing apparatus according to another exemplary embodiment.

Hereinafter, a plasma processing apparatus according to another exemplary embodiment will be described with reference to FIG. 3. FIG. 3 is an enlarged view of a part of a plasma processing apparatus according to another exemplary embodiment. A plasma processing apparatus 1B shown in FIG. 3 is different from the plasma processing apparatus 1 in that the plasma processing apparatus 1B is provided with a variable impedance circuit 81a and a variable impedance circuit 81b, instead of the variable impedance circuit 81. Further, the plasma processing apparatus 1B is different from the plasma processing apparatus 1 in that the plasma processing apparatus 1B is provided with a variable impedance circuit 82a and a variable impedance circuit 82b, instead of the variable impedance circuit 82. In other respects, the configuration of the plasma processing apparatus 1B may be the same as the configuration of the plasma processing apparatus 1.

The variable impedance circuit 81a is a variable impedance circuit for the radio frequency power HF. The variable impedance circuit 81b is a variable impedance circuit for the bias power LF. The variable impedance circuit 81a and the variable impedance circuit 81b are connected in parallel on the first electrical path 71. Each of the variable impedance circuit 81a and the variable impedance circuit 81b may be a circuit having any configuration as long as it is a circuit in which the impedance thereof is variable. In an example, each of the variable impedance circuit 81a and the variable impedance circuit 81b can include a variable capacitance capacitor.

The variable impedance circuit 82a is a variable impedance circuit for the radio frequency power HF. The variable impedance circuit 82b is a variable impedance circuit for the bias power LF. The variable impedance circuit 82a and the variable impedance circuit 82b are connected in parallel on the second electrical path 72. Each of the variable impedance circuit 82a and the variable impedance circuit 82b may be a circuit having any configuration as long as it is a circuit in which the impedance thereof is variable. In an example, each of the variable impedance circuit 82a and the variable impedance circuit 82b can include a variable capacitance capacitor.

In the plasma processing apparatus 1B, the controller MC controls the impedance of at least one of the variable impedance circuits 81a and 82a. Further, the controller MC further controls the impedance of at least one of the variable impedance circuits 81b and 82b. These impedances are controlled according to the above-described measurement values acquired by the at least one sensor (e.g. the sensor 83 and/or the sensor 84).

Alternatively, the controller MC may be configured to set the impedance of at least one of the variable impedance circuits 81a and 82a to impedance determined in advance according to the level of the voltage $V_N$. Further, the controller MC may be further configured to set the impedance of at least one of the variable impedance circuits 81b and 82b to impedance determined in advance according to the level of the voltage $V_N$.

Figure 4:
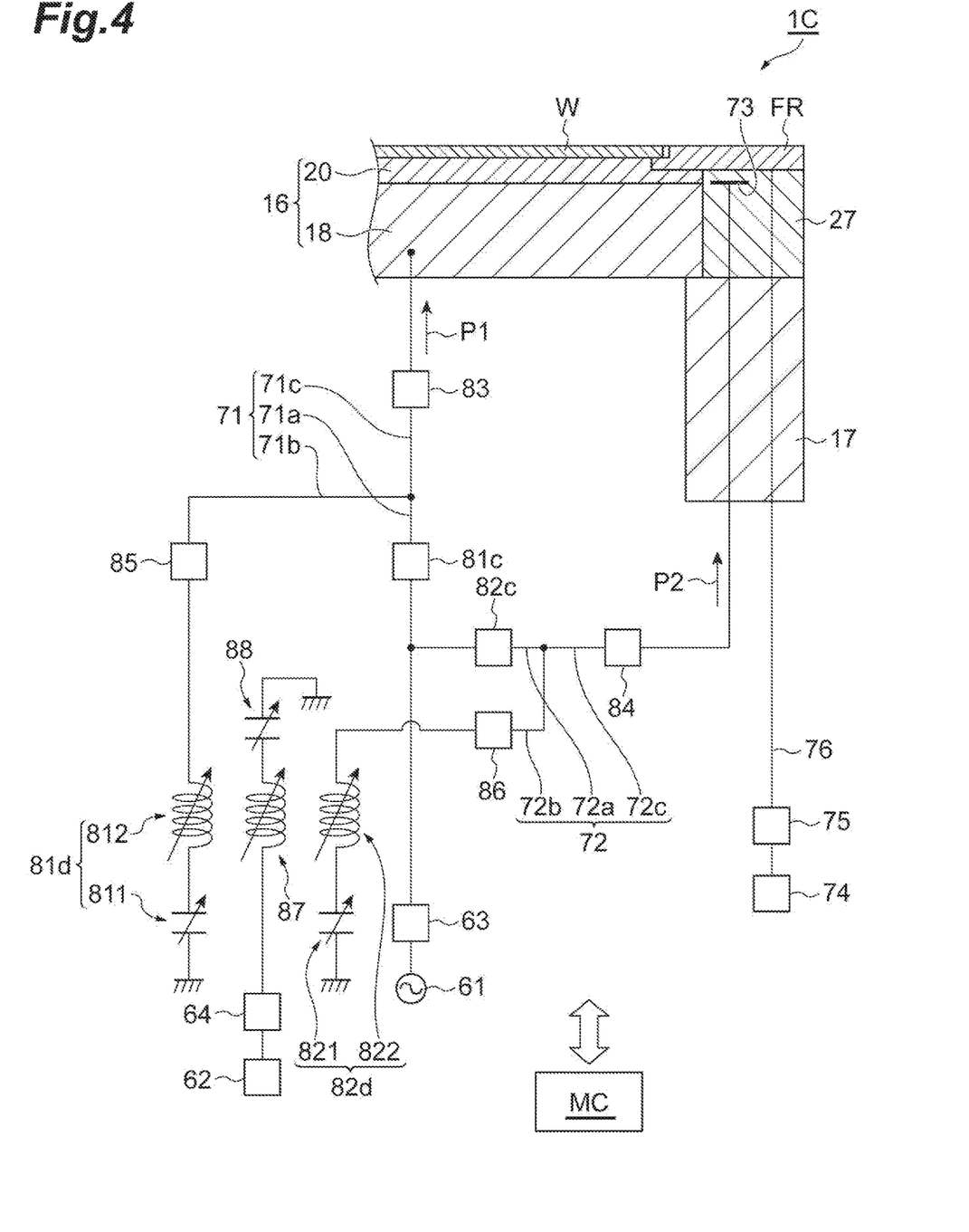
FIG. 4 is an enlarged view of a part of a plasma processing apparatus according to still another exemplary embodiment.

Hereinafter, a plasma processing apparatus according to still another exemplary embodiment will be described with reference to FIG. 4. FIG. 4 is an enlarged view of a part of the plasma processing apparatus according to still another exemplary embodiment. A plasma processing apparatus 1C shown in FIG. 4 is different from the plasma processing apparatus 1 in that the plasma processing apparatus 1C is provided with a variable impedance circuit 81c and a variable impedance circuit 81d, instead of the variable impedance circuit 81. Further, the plasma processing apparatus 1C is different from the plasma processing apparatus 1 in that the plasma processing apparatus 1C is provided with a variable impedance circuit 82c and a variable impedance circuit 82d, instead of the variable impedance circuit 82. Further, the configuration of each of the first electrical path 71 and the second electrical path 72 of the plasma processing apparatus 1C is different from the configuration of each of the first electrical path 71 and the second electrical path 72 of the plasma processing apparatus 1. Further, the plasma processing apparatus 1C is further provided with a low-pass filter 85 and a low-pass filter 86. In other respects, the configuration of the plasma processing apparatus 1C may be the same as the configuration of the plasma processing apparatus 1.

In the plasma processing apparatus 1C, the first electrical path 71 includes a first partial path 71a, a second partial path 71b, and a third partial path 71c. The first partial path 71a and the second partial path 71b merge with the third partial path 71c. The first partial path 71a connects the matching circuit 63 and the third partial path 71c to each other. The third partial path 71c is connected to the lower electrode 18. The sensor 83 is provided on the third partial path 71c.

The variable impedance circuit 81c is a variable impedance circuit for the radio frequency power HF and is provided on the first partial path 71a. The variable impedance circuit 81c may be a circuit having any configuration as long as it is a circuit in which the impedance thereof is variable. In an example, the variable impedance circuit 81c can include a variable capacitance capacitor.

The variable impedance circuit 81*d* is a variable impedance circuit for the bias power LF and is provided on the second partial path 71*b*. The low-pass filter 85 is further provided on the second partial path 71*b*. The variable impedance circuit 81*d* may be a circuit having any configuration as long as it is a circuit in which the impedance thereof is variable.

In an example, the variable impedance circuit 81*d* includes a variable capacitance capacitor 811 and a variable inductor 812. The variable capacitance capacitor 811 and the variable inductor 812 are connected in series between the ground and the low-pass filter 85. The variable inductor 812 is electromagnetically coupled to a variable inductor 87. One end of the variable inductor 87 is connected to the matching circuit 64. The other end of the variable inductor 87 is connected to the ground through a variable capacitance capacitor 88. The bias power LF is supplied to the second partial path 71*b* by electromagnetic induction between the variable inductor 87 and the variable inductor 812. The bias power LF supplied to the second partial path 71*b* is supplied to the lower electrode 18 through the third partial path 71*c*.

In the plasma processing apparatus 1C, the second electrical path 72 includes a fourth partial path 72*a*, a fifth partial path 72*b*, and a sixth partial path 72*c*. The fourth partial path 72*a* and the fifth partial path 72*b* merge with the sixth partial path 72*c*. The fourth partial path 72*a* connects the matching circuit 63 and the sixth partial path 72*c* to each other. The sixth partial path 72*c* is connected to the electrode 73. The sensor 84 is provided on the sixth partial path 72*c*.

The variable impedance circuit 82*c* is a variable impedance circuit for the radio frequency power HF and is provided on the fourth partial path 72*a*. The variable impedance circuit 82*c* may be a circuit having any configuration as long as it is a circuit in which the impedance thereof is variable. In an example, the variable impedance circuit 82*c* can include a variable capacitance capacitor.

The variable impedance circuit 82*d* is a variable impedance circuit for the bias power LF and is provided on the fifth partial path 72*b*. The low-pass filter 86 is further provided on the fifth partial path 72*b*. The variable impedance circuit 82*d* may be a circuit having any configuration as long as it is a circuit in which the impedance thereof is variable.

In an example, the variable impedance circuit 82*d* includes a variable capacitance capacitor 821 and a variable inductor 822. The variable capacitance capacitor 821 and the variable inductor 822 are connected in series between the ground and the low-pass filter 86. The variable inductor 822 is electromagnetically coupled to the variable inductor 87. The bias power LF is supplied to the fifth partial path 72*b* by electromagnetic induction between the variable inductor 87 and the variable inductor 822. The bias power LF supplied to the fifth partial path 72*b* is supplied to the focus ring FR through the sixth partial path 72*c*.

In the plasma processing apparatus 1C, the controller MC controls the impedance of at least one of the variable impedance circuits 81*c* and 82*c*. Further, the controller MC further controls the impedance of at least one of the variable impedance circuits 81*d* and 82*d*. These impedances are controlled according to the above-described measurement values acquired by the at least one sensor (e.g. the sensor 83 and/or the sensor 84).

Alternatively, the controller MC may be configured to set the impedance of at least one of the variable impedance circuits 81*c* and 82*c* to an impedance determined in advance according to the level of the voltage $V_N$. Further, the controller MC may be further configured to set the impedance of at least one of the variable impedance circuits 81*d* and 82*d* to an impedance determined in advance according to the level of the voltage $V_N$.

Figure 5:
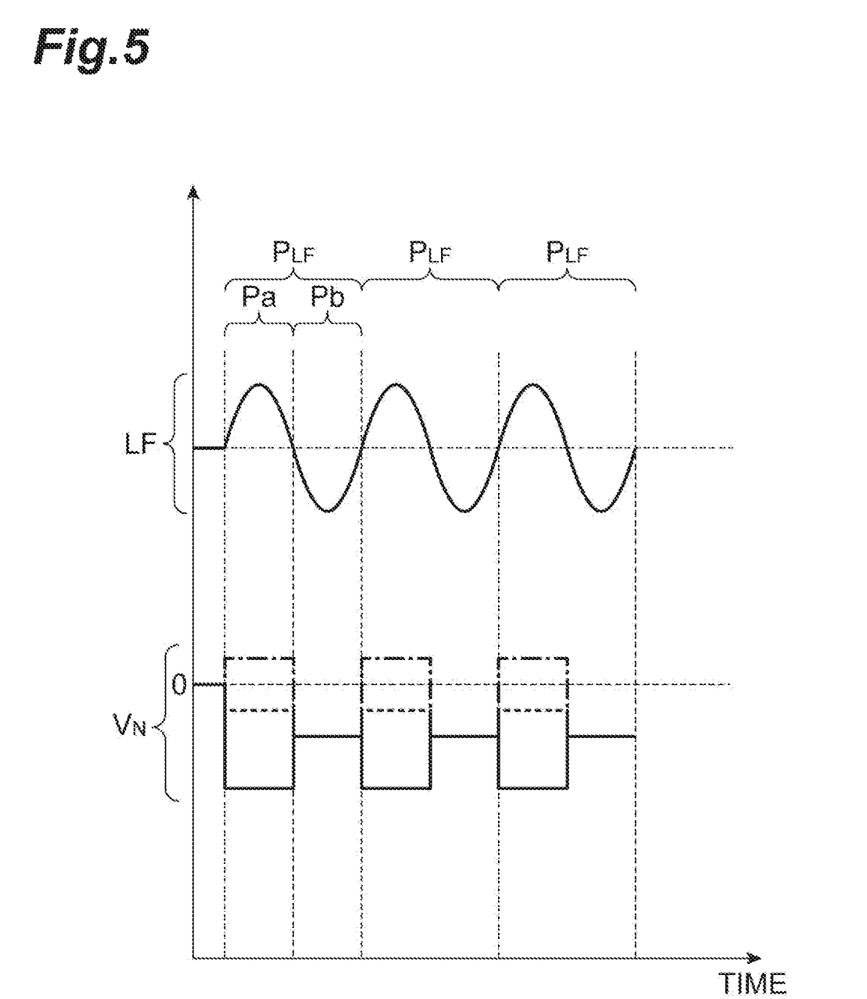
FIG. 5 is a diagram showing an example of a voltage which is applied to a focus ring by a sheath adjuster.

Hereinafter, FIG. 5 is referred to. FIG. 5 is a diagram showing an example of the voltage which is applied to a focus ring by a sheath adjuster. In FIG. 5, radio frequency power is shown as the bias power LF. In each of the plasma processing apparatus 1, the plasma processing apparatus 1B, and the plasma processing apparatus 1C, the level of the voltage $V_N$ may change within each cycle $P_{LF}$ of the bias power LF. In an embodiment, each cycle $P_{LF}$ of the bias power LF includes a first partial period Pa and a second partial period Pb. The second partial period Pb is a period different from the first partial period Pa. The level of the voltage $V_N$ that the sheath adjuster 74 applies to the focus ring FR in the first partial period Pa may be different from the level of the voltage $V_N$ that the sheath adjuster 74 applies to the focus ring FR in the second partial period Pb.

In an example, within each cycle $P_{LF}$, the period in which the sheath becomes relatively thin is the first partial period Pa, and within each cycle $P_{LF}$, the period in which the sheath becomes relatively thick is the second partial period Pb. Within each cycle $P_{LF}$, the etching of the substrate W mainly proceeds in the second partial period Pb in which ions having relatively high energy are supplied to the substrate W. Therefore, in the second partial period Pb, the voltage $V_N$ having a level determined to eliminate or reduce the difference between the upper end position of the sheath above the substrate W and the upper end position of the sheath on/above the focus ring FR is applied to the focus ring FR. On the other hand, in the first partial period Pa, since the sheath is relatively thin, the plasma may enter between the focus ring FR and the edge of the substrate W. In order to suppress the plasma from entering between the focus ring FR and the edge of the substrate W, in the first partial period Pa, the voltage $V_N$ having a relatively large absolute value may be applied to the focus ring FR. That is, as shown by a solid line in FIG. 5, in the first partial period Pa, the voltage $V_N$ having a larger absolute value than the voltage $V_N$ which is applied to the focus ring FR in the second partial period Pb may be applied to the focus ring FR.

Alternatively, in the first partial period Pa, the level of the voltage $V_N$ may be set to suppress the plasma from entering between the focus ring FR and the edge of the substrate W and make the sheath thickness uniform on/above the edge region of the substrate W. Specifically, as shown by a dotted line in FIG. 5, the voltage $V_N$ having an absolute value smaller than the absolute value of the voltage $V_N$ which is applied to the focus ring FR in the second partial period Pb may be applied to the focus ring FR in the first partial period Pa. Alternatively, as shown by a one-dot chain line in FIG. 5, in the first partial period Pa, a positive voltage may be applied to the focus ring FR.

In a case where the bias power LF is radio frequency power, the period in which the potential of the lower electrode 18 is positive may be the first partial period Pa, and the period in which the potential of the lower electrode 18 is negative may be the second partial period Pb. In this case, the first partial period Pa and the second partial period Pb are specified from the potential of the lower electrode 18 acquired by a voltage sensor, for example. Alternatively, in a case where the bias power LF is radio frequency power, the period in which the voltage of the bias power LF which is output from the power source 62 is positive may be the first partial period Pa, and the period in which the voltage of the bias power LF which is output from the power source 62 is negative may be the second partial period Pb. In this case, the voltage $V_N$ is synchronized with the bias power LF. In a case where the bias power LF is a pulsed negative direct-current voltage, the period in which the negative direct-current voltage is applied to the lower electrode 18 may be the second partial period Pb, and the other period may be the first partial period Pa.

In a case where the level of the voltage $V_N$ is changed within each cycle $P_{LF}$ of the bias power LF, the impedance of each of the variable impedance circuits described above may be set to an impedance determined in advance according to the level of the voltage $V_N$ in the first partial period Pa or the second partial period Pb. Alternatively, the impedance of each of the variable impedance circuits described above may be set to an impedance determined in advance according to the average value of the level of the voltage $V_N$ within each cycle $P_{LF}$. Alternatively, the impedance of each of the variable impedance circuits described above may be set according to the measurement value which is acquired by the at least one sensor described above in the first partial period Pa or the second partial period Pb. Alternatively, the impedance of each of the variable impedance circuits described above may be set according to the average value of the measurement values which are acquired by the at least one sensor described above within each cycle $P_{LF}$.

Each cycle $P_{LF}$ of the bias power LF may include three or more partial periods different from each other. The levels of the voltages VN which are applied to the focus ring FR in the respective three or more partial periods which are included in each cycle $P_{LF}$ of the bias power LF may be different from each other. Hereinafter, an example will be described in which each cycle $P_{LF}$ includes first to fourth sub-periods as the three or more partial periods. In this example, the second sub-period is a period after the first sub-period, the third sub-period is a period after the second sub-period, and the fourth sub-period is a period after the third sub-period. The first sub-period and the second sub-period may be periods which are included in the first partial period Pa described above. The first sub-period may be a first half period in the first partial period Pa, and the second sub-period may be a second half period in the first partial period Pa. The third sub-period and the fourth sub-period may be periods which are included in the second partial period Pb described above. The third sub-period may be a first half period in the second partial period Pb, and the fourth sub-period may be a second half period in the second partial period Pb. In the first sub-period, the negative voltage $V_N$ having an absolute value larger than the absolute value of the negative voltage $V_N$ which is applied to the focus ring FR in the second sub-period may be applied to the focus ring FR. Further, in the third sub-period, the negative voltage $V_N$ having an absolute value larger than the absolute value of the negative voltage $V_N$ which is applied to the focus ring FR in the fourth sub-period may be applied to the focus ring FR.

In FIG. 5, the waveform of the bias power LF is shown as a sine wave. That is, in the waveform of the bias power LF shown in FIG. 5, the waveform from zero to the maximum value and the waveform from the maximum value to zero are symmetrical to each other, and the waveform from zero to the minimum value and the waveform from the minimum value to zero are symmetrical to each other. However, in each cycle $P_{LF}$ in which the bias power LF is applied, the potential in the focus ring FR may transition asymmetrically due to the difference between the mass of an electron and the mass of an ion. Therefore, the voltage $V_N$ which is applied to the focus ring FR may be set according to the transition of the potential (that is, the transition of the asymmetric potential) in the focus ring FR in each cycle $P_{LF}$ in which the bias power LF is applied. That is, the time lengths of each of the plurality of partial periods (the plurality of sub-periods) in each cycle $P_{LF}$ may be set to different lengths according to the transition of the potential (that is, the waveform of the potential) in the focus ring FR. By applying the voltage $V_N$ having an optimum level in each of the plurality of partial periods (that is, the plurality of sub-periods) in each cycle $P_{LF}$, it becomes possible to more precisely control the thickness of the sheath.

Further, in another example, the average value of the level of the voltage $V_N$ which is applied to the focus ring FR may change in the repetition of the cycle $P_{LF}$.

Figure 6:
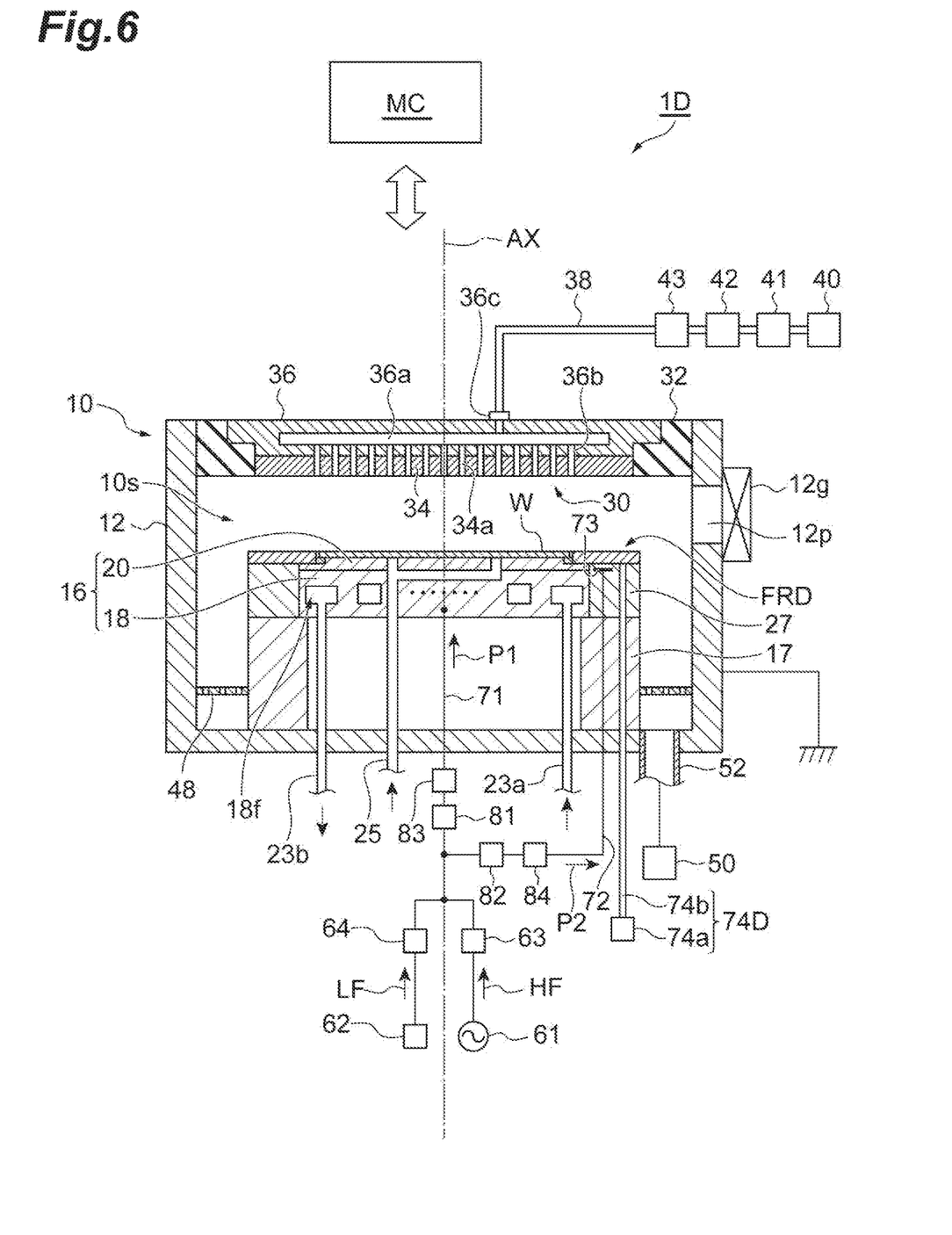
FIG. 6 schematically illustrates a plasma processing apparatus according to still another exemplary embodiment.
Figure 7A:
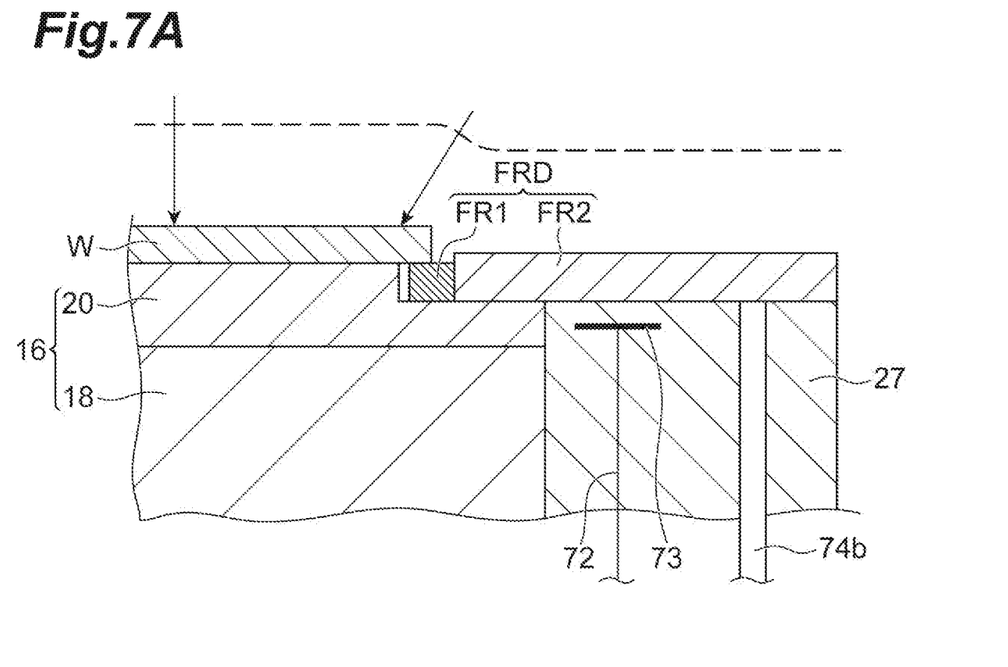
FIG. 7A illustrates an example of a position in a vertical direction of an upper end of a sheath in a state where a focus ring has worn down.
Figure 7B:
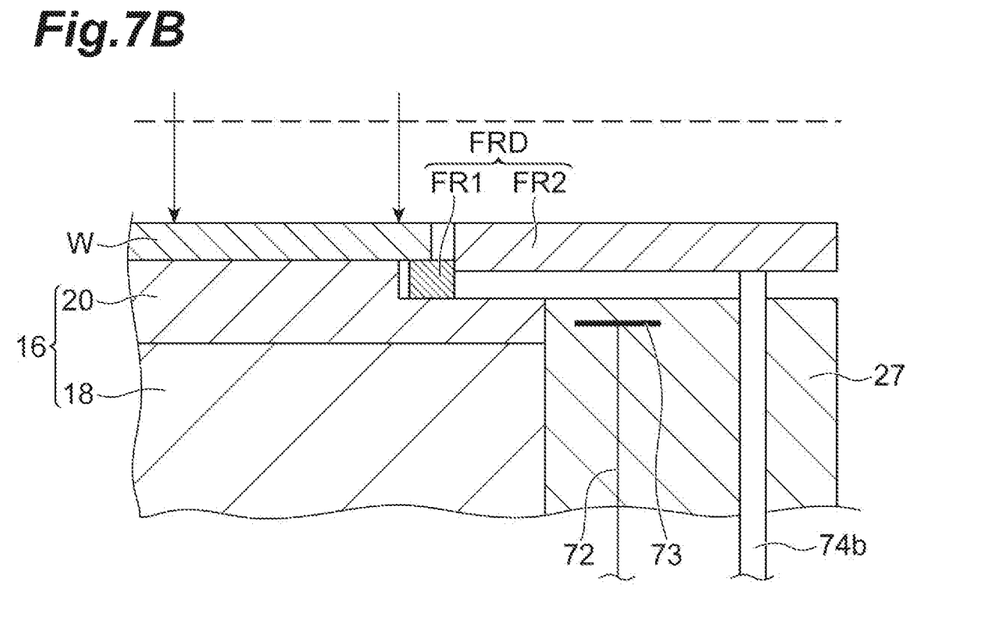
FIG. 7B illustrates an example of a corrected position in a vertical direction of an upper end of a sheath.

Hereinafter, FIGS. 6, 7A, and 7B are referred to. FIG. 6 schematically illustrates a plasma processing apparatus according to still another exemplary embodiment. FIG. 7A is illustrates an example of a position in a vertical direction of an upper end of a sheath in a state where a focus ring has worn down, and FIG. 7B illustrates an example of a corrected position in a vertical direction of an upper end of the sheath. In each of FIG. 7A and FIG. 7B, the upper end position of the sheath is indicated by a broken line. Further, in each of FIG. 7A and FIG. 7B, the traveling direction of ions to the substrate W is indicated by an arrow.

A plasma processing apparatus 1D shown in FIG. 6 is different from the plasma processing apparatus 1 in that the plasma processing apparatus 1D uses a focus ring FRD instead of the focus ring FR. Further, the plasma processing apparatus 1D is different from the plasma processing apparatus 1 in that the plasma processing apparatus 1D is provided with a sheath adjuster 74D instead of the sheath adjuster 74. In other respects, the configuration of the plasma processing apparatus 1D may be the same as the configuration of the plasma processing apparatus 1.

As shown in FIGS. 7A and 7B, the focus ring FRD has a first annular part FR1 and a second annular part FR2. The first annular part FR1 and the second annular part FR2 are separated from each other. The first annular part FR1 has an annular plate shape and is placed on the focus ring placing region so as to extend around the axis AX. The substrate W is placed on the substrate placing region such that the edge thereof is located on the first annular part FR1. The second annular part FR2 has an annular plate shape and is placed on the focus ring placing region so as to extend around the axis AX. The second annular part FR2 is located outside the first annular part FR1 in the radial direction.

The sheath adjuster 74D is a movement device configured to move the focus ring FRD upward in order to adjust the position in the vertical direction of the upper surface of the focus ring FRD. Specifically, the sheath adjuster 74D is configured to move the second annular part FR2 upward in order to adjust the position in the vertical direction of the upper surface of the second annular part FR2. In an example, the sheath adjuster 74D includes a drive device 74a and a shaft 74b. The shaft 74b supports the second annular part FR2 and extends downward from the second annular part FR2. The drive device 74a is configured to generate a driving force for moving the second annular part FR2 in the vertical direction through the shaft 74b.

When the plasma etching of the substrate W is performed, the focus ring FRD wears down as shown in FIG. 7A. In a case where the focus ring FRD has worn down, the thickness of the second annular part FR2 decreases, and thus the position in the vertical direction of the upper surface of the second annular part FR2 becomes low. In a case where the position in the vertical direction of the upper surface of the second annular part FR2 becomes low, the upper end position of the sheath on/above the focus ring FRD becomes lower than the upper end position of the sheath on/above the substrate W. As a result, the upper end of the sheath is inclined in the vicinity of the edge of the substrate W, so that the traveling direction of ions which are supplied to the edge of the substrate W becomes a direction inclined with respect to the vertical direction.

In order to correct the traveling direction of ions to the vertical direction, the sheath adjuster 74D is configured to adjust the upper end position of the sheath on/above the focus ring FRD. The sheath adjuster 74D adjusts the upper end position of the sheath on/above the focus ring FRD to eliminate or reduce the difference between the upper end position of the sheath on/above the focus ring FRD and the upper end position of the sheath on/above the substrate W. Specifically, the sheath adjuster 74D moves the second annular part FR2 upward to make the position in the vertical direction of the upper surface of the second annular part FR2 coincide with the position in the vertical direction of the upper surface of the substrate W on the electrostatic chuck 20.

The adjustment amount of the upper end position of the sheath, that is, the amount of movement of the second annular part FR2 is determined according to a parameter which reflects the thickness of the focus ring FRD, that is, the thickness of the second annular part FR2. This parameter can be the measured value of the thickness of the second annular part FR2 which is measured optically or electrically, the position in the vertical direction of the upper surface of the second annular part FR2 which is measured optically or electrically, or the length of the time when the focus ring FRD has been exposed to the plasma. The amount of movement of the second annular part FR2 is determined using a predetermined relationship between such a parameter and the amount of movement of the second annular part FR2. For example, the predetermined relationship between the parameter and the amount of movement of the second annular part FR2 is determined in advance such that the amount of movement of the second annular part FR2 increases as the thickness of the second annular part FR2 decreases. When the second annular part FR2 is moved upward by the determined amount of movement, as shown in FIG. 7B, the difference between the upper end position of the sheath on/above the focus ring FRD and the upper end position of the sheath on/above the substrate W is eliminated or reduced.

In the plasma processing apparatus 1D, the controller MC can determine the amount of movement of the second annular part FR2, as described above. The predetermined relationship between the parameter described above and the amount of movement of the second annular part FR2 may be stored in the storage device of the controller MC as a function or table format data. The controller MC can control the sheath adjuster 74D to move the second annular part FR2 upward by the determined amount of movement.

When the upper end position of the sheath is corrected by the sheath adjuster 74D, the impedance of the path from the second electrical path 72 to the plasma through the focus ring FRD increases. This is because the gap between the second annular part FR2 and the electrode 73 is widened. In a case where the impedance of the path from the second electrical path 72 to the plasma through the focus ring FRD increases, the electric power P2 decreases. Further, in a case where the impedance of the path from the second electrical path 72 to the plasma through the focus ring FRD increases, the electric power P1 increases relatively. As a result, the etching rate of the substrate W inside the edge becomes higher than the etching rate at the edge of the substrate W. Therefore, in the plasma processing apparatus 1D, the impedance of at least one of the variable impedance circuits 81 and 82 is adjusted, as with the plasma processing apparatus 1.

In the plasma processing apparatus 1D, the impedance of at least one of the variable impedance circuits 81 and 82 may be controlled by the controller MC, as with the plasma processing apparatus 1. The impedance of the at least one variable impedance circuit may be controlled according to the measurement value acquired by the at least one sensor described above.

Alternatively, the controller MC may be configured to set the impedance of at least one of the variable impedance circuits 81 and 82 to an impedance determined in advance according to the amount of movement of the second annular part FR2. The impedance corresponding to the amount of movement of the second annular part FR2 is determined in advance such that the power level of the electric power P1 is substantially constant without depending on the amount of movement of the second annular part FR2. The impedance corresponding to the amount of movement of the second annular part FR2 may be stored in the storage device of the controller MC as a function or table fox mat data.

The focus ring FRD and the sheath adjuster 74D may be adopted in place of the focus ring FR and the sheath adjuster 74 in each of the plasma processing apparatus 1B and the plasma processing apparatus 1C.

Figure 8:
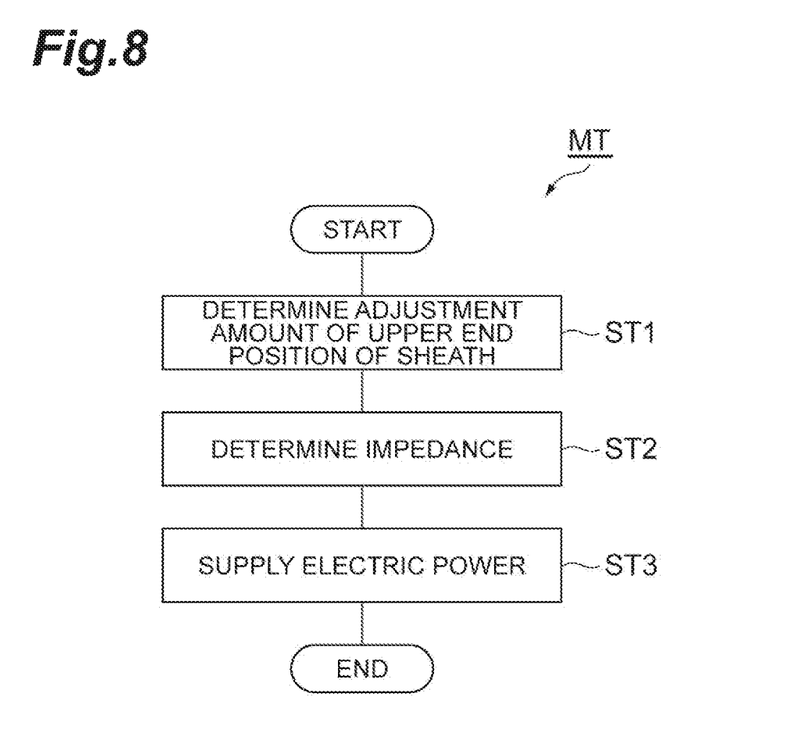
FIG. 8 is a flow diagram showing an etching method according to an exemplary embodiment.

Hereinafter, FIG. 8 is referred to. FIG. 8 is a flow diagram showing an etching method according to an exemplary embodiment. An etching method MT shown in FIG. 8 is executed using any one of the plasma processing apparatuses according to various embodiments, such as the plasma processing apparatus 1, the plasma processing apparatus 1B, the plasma processing apparatus 1C, and the plasma processing apparatus 1D.

In the etching method MT, the substrate W is placed in a region surrounded by the focus ring and on the electrostatic chuck 20. In step ST1 of the etching method MT, the adjustment amount of the upper end position of the sheath which is to be set by the sheath adjuster (the sheath adjuster 74 or the sheath adjuster 74D) is determined. With respect to the determination of the adjustment amount of the upper end position of the sheath, refer to the above description regarding the plasma processing apparatus 1, the plasma processing apparatus 1B, the plasma processing apparatus 1C, and the plasma processing apparatus 1D.

In step ST2 of the etching method MT, the impedance of the at least one variable impedance circuit is determined. The impedance of the at least one variable impedance circuit is determined to set the power level of the electric power P1 flowing through the first electrical path 71 to a predetermined level. With respect to the determination of the impedance of the at least one variable impedance circuit, refer to the above description regarding the plasma processing apparatus 1, the plasma processing apparatus 1B, the plasma processing apparatus 1C, and the plasma processing apparatus 1D.

In the etching method MT, gas is supplied into the chamber 10 from the gas supply unit. Then, the pressure in the chamber 10 is set to a specified pressure by the exhaust device 50. In step ST3 of the etching method MT, the radio frequency power HF and the bias power LF are supplied through the first electrical path 71 and the second electrical path 72 for plasma etching of the substrate W. In a case where the radio frequency power source 61 is electrically connected to the upper electrode 30, the radio frequency power HF is supplied to the upper electrode 30 and the bias power LF is supplied through the first electrical path 71 and the second electrical path 72. Step ST3 is performed in a state where the upper end position of the sheath is adjusted by the adjustment amount determined in step ST1 by the sheath adjuster and the impedance of the at least one variable impedance circuit is adjusted to the impedance determined in step ST2.

According to the etching method MT, the traveling direction of ions which are supplied to the edge of the substrate W can be corrected to the vertical direction. Further, according to the etching method MT, it becomes possible to reduce the difference between the etching rate at the edge of the substrate and the etching rate of the substrate inside the edge.

While various exemplary embodiments have been described above, various omissions, substitutions and changes may be made without being limited to the exemplary embodiments described above. Elements of the different embodiments may be combined to form another embodiment.

The plasma processing apparatus according to another embodiment may be an inductively coupled plasma processing apparatus. Further, the plasma processing apparatus according to still another embodiment may be a plasma processing apparatus that generates plasma by using surface waves such as microwaves.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a chamber;
   a substrate support having an electrostatic chuck, wherein the substrate support is configured to support a focus ring and a substrate placed thereon in the chamber;
   a first power source configured to generate an electric power having periodicity, the electric power being a radio frequency power having a sinusoidal waveform, and each cycle of the sinusoidal waveform includes a first partial period and a second partial period having a different voltage from the first partial period;
   a matching circuit connected between the first power source and the substrate support;
   a first electrical path connecting the matching circuit and the substrate support to each other;
   a second electrical path that is different from the substrate support and the first electrical path and configured to supply the electric power from the matching circuit to the focus ring;
   a sheath adjuster configured to adjust a position in a vertical direction of an upper end of a sheath on/above the focus ring; and
   a variable impedance circuit on the first electrical path or the second electrical path, wherein
   the sheath adjuster is a second power source configured to apply a voltage to the focus ring, and is configured to change a level of the voltage applied to the focus ring in the second partial period from a level of the voltage applied to the focus ring in the first partial period.

2. The plasma processing apparatus according to claim 1, wherein
   the sheath adjuster is configured to apply a negative voltage as the voltage applied to the focus ring.

3. The plasma processing apparatus according to claim 1, further comprising:
   a sensor configured to acquire a measurement value reflecting a power level of an electric power flowing through the first electrical path; and
   a controller configured to control an impedance of the variable impedance circuit according to the measurement value to set a power level of an electric power flowing through the first electrical path to a predetermined level.

4. The plasma processing apparatus according to claim 2, further comprising:
   a controller configured to set an impedance of the variable impedance circuit to an impedance determined in advance according to a level of the negative voltage.

5. The plasma processing apparatus according to claim 1, wherein
   a first variable impedance circuit, which is the variable impedance circuit, is on the first electrical path, and
   the plasma processing apparatus further comprises a second variable impedance circuit on the second electrical path.

6. The plasma processing apparatus according to claim 5, wherein
   the sheath adjuster is configured to apply a negative voltage as the voltage applied to the focus ring.

7. The plasma processing apparatus according to claim 5, further comprising:
   a first sensor configured to acquire a first measurement value representing a power level of an electric power flowing through the first electrical path;
   a second sensor configured to acquire a second measurement value representing a power level of an electric power flowing through the second electrical path; and
   a controller configured to control an impedance of the first variable impedance circuit and/or an impedance of the second variable impedance circuit according to the first measurement value and/or the second measurement value to set a power level of an electric power flowing through the first electrical path to a predetermined level.

8. The plasma processing apparatus according to claim 6, further comprising:
   a controller configured to set an impedance of the first variable impedance circuit and an impedance of the second variable impedance circuit to respective impedances determined in advance according to a level of the negative voltage.

9. An etching method using a plasma processing apparatus,
   the plasma processing apparatus including
   a chamber, a substrate support having an electrostatic chuck, wherein the substrate support is configured to support a focus ring and a substrate placed thereon in the chamber,
   a first power source configured to generate an electric power having periodicity, the electric power being a radio frequency power having a sinusoidal waveform, and each cycle of the sinusoidal waveform includes a first partial period and a second partial period having a different voltage from the first partial period,
   a matching circuit connected between the first power source and the substrate support,
   a first electrical path connecting the matching circuit and the substrate support to each other, a second electrical path that is separate from the substrate support and the first electrical path and configured to supply the electric power from the matching circuit to the focus ring, a sheath adjuster configured to adjust a position in a vertical direction of an upper end of a sheath on/above the focus ring, and a variable impedance circuit on the first electrical path or the second electrical path, the sheath adjuster being a second power source configured to apply a voltage to the focus ring, and configured to change a level of the voltage applied to the focus ring in the second partial period from a level of the voltage applied to the focus ring in the first partial period, the etching method comprising:

determining an adjustment amount of a position in a vertical direction of an upper end of the sheath which is to be set by the sheath adjuster;

determining an impedance of the variable impedance circuit to set a power level of an electric power flowing through the first electrical path to a predetermined level; and supplying the electric power which is generated by the first power source through the first electrical path and the second electrical path for plasma etching of a substrate placed on the electrostatic chuck in a state where a position in the vertical direction of the upper end of the sheath is adjusted by the determined adjustment amount by the sheath adjuster and the impedance of the variable impedance circuit is adjusted to the determined impedance.

10. The plasma processing apparatus according to claim 1, wherein the sheath adjuster is configured to adjust the position in the vertical direction of the upper end of the sheath on/above the focus ring to eliminate or reduce a difference between the position in the vertical direction of the upper end of the sheath on/above the focus ring and a position in the vertical direction of an upper end of a sheath on/above the substrate.

11. The plasma processing apparatus according to claim 1, wherein the first electrical path and the second electrical path shares a common electrical path which branches into the first electrical path and the second electrical path, and the variable impedance circuit is connected between the common electrical path and the substrate support or the focus ring.

12. A plasma processing apparatus comprising:

a chamber;

a substrate support having an electrostatic chuck, wherein the substrate support is configured to support a focus ring and a substrate placed thereon in the chamber;

a first power source configured to generate an electric power that is a pulsed negative[-]direct-current voltage having a periodic cycle including a first partial period in which a first voltage is generated and a second partial period in which a second voltage, that is different from the first voltage is generated, a matching circuit connected between the first power source and the substrate support;

a first electrical path connecting the matching circuit and the substrate support to each other;

a second electrical path that is different from the substrate support and the first electrical path and configured to supply the electric power from the matching circuit to the focus ring; a sheath adjuster configured to adjust a position in a vertical direction of an upper end of a sheath on/above the focus ring; and a variable impedance circuit on the first electrical path or the second electrical path, wherein the sheath adjuster is a second power source configured to apply a voltage to the focus ring, and is configured to change a level of the voltage applied to the focus ring in the second partial period from a level of the voltage applied to the focus ring in the first partial period.

13. The plasma processing apparatus according to claim 1, wherein the substrate support further includes a lower electrode, and the first electrical path connects the matching circuit and the lower electrode to each other.

14. The plasma processing apparatus according to claim 13, wherein a potential of the lower electrode is positive in the first partial period and a potential of the lower electrode is negative in the second partial period, and an absolute value of a negative voltage applied to the focus ring by the sheath adjuster in the second partial period is smaller than an absolute value of a negative voltage applied to the focus ring by the sheath adjuster in the first partial period.

15. The plasma processing apparatus according to claim 12, wherein the substrate support further includes a lower electrode, and the first electrical path connects the matching circuit and the lower electrode to each other.

16. The plasma processing apparatus according to claim 13, wherein an absolute value of a negative voltage applied to the focus ring by the sheath adjuster in the second partial period is smaller than an absolute value of a negative voltage applied to the focus ring by the sheath adjuster in the first partial period.

* * * * *